United States Patent [19]
Bae et al.

[11] Patent Number: 5,638,141
[45] Date of Patent: Jun. 10, 1997

[54] BROADCAST SIGNAL RECEIVER HAVING A LOW-NOISE AMPLIFIER INSERTED BEFORE A TUNER

[75] Inventors: Dae-sik Bae; Byung-suk Kang, both of Suwon, Rep. of Korea

[73] Assignee: Samsung Electronics Co., Ltd., Kyungki-Do, Rep. of Korea

[21] Appl. No.: 431,742

[22] Filed: May 1, 1995

[30] Foreign Application Priority Data

Apr. 29, 1994 [KR] Rep. of Korea .................. 94-9301
Apr. 18, 1995 [KR] Rep. of Korea .................. 95-9129

[51] Int. Cl.$^6$ .................. H04N 5/44; H04N 5/46
[52] U.S. Cl. .................. 348/735; 455/3.2; 455/249.1; 455/245.2
[58] Field of Search .................. 348/725, 735, 348/678; 455/3.2, 234.2, 240.1, 249.1, 245.2; H04N 5/44, 5/46

[56] References Cited

U.S. PATENT DOCUMENTS

| | | | |
|---|---|---|---|
| 3,581,210 | 5/1971 | Amfahr | 455/249.1 |
| 4,030,035 | 6/1977 | Ienaka et al. | 455/245.2 |
| 4,553,105 | 11/1985 | Sasaki | 455/249.1 |
| 5,034,819 | 7/1991 | Tsukagoshi | 348/731 |
| 5,134,707 | 7/1992 | Sakashita et al. | 455/3.2 |
| 5,276,904 | 1/1994 | Mutzig et al. | 455/3.2 |
| 5,280,643 | 1/1994 | Ishii | 455/249.1 |
| 5,465,408 | 11/1995 | Sugayama et al. | 455/249.1 |

*Primary Examiner*—Glenton B. Burgess
*Attorney, Agent, or Firm*—Sughrue, Mion, Zinn, Macpeak & Seas

[57] ABSTRACT

A broadcast signal receiver having improved sensitivity includes a tuner for tuning an RF signal input via an antenna to an IF signal of a specific channel, an IF signal processor for processing the IF signal output from the tuner to a video signal. A low noise amplifier is installed in front of the tuner for amplifying the RF signal and outputting the result to the tuner. The low noise amplifier has a noise figure lower than that of the tuner, to thereby enhance the noise figure of the overall system and the sensitivity of the receiver.

7 Claims, 4 Drawing Sheets

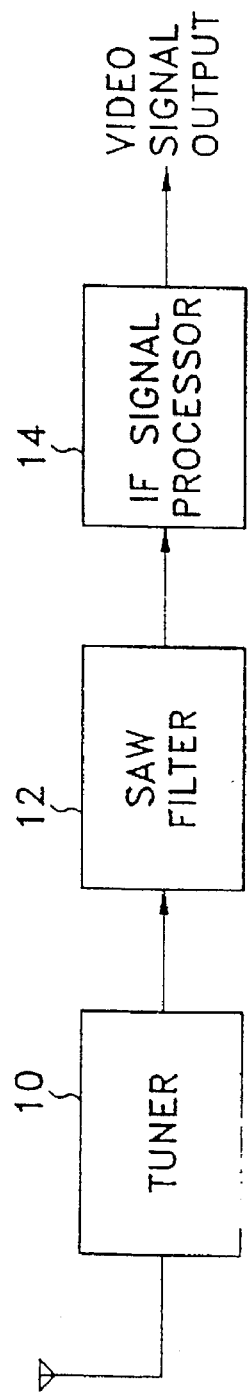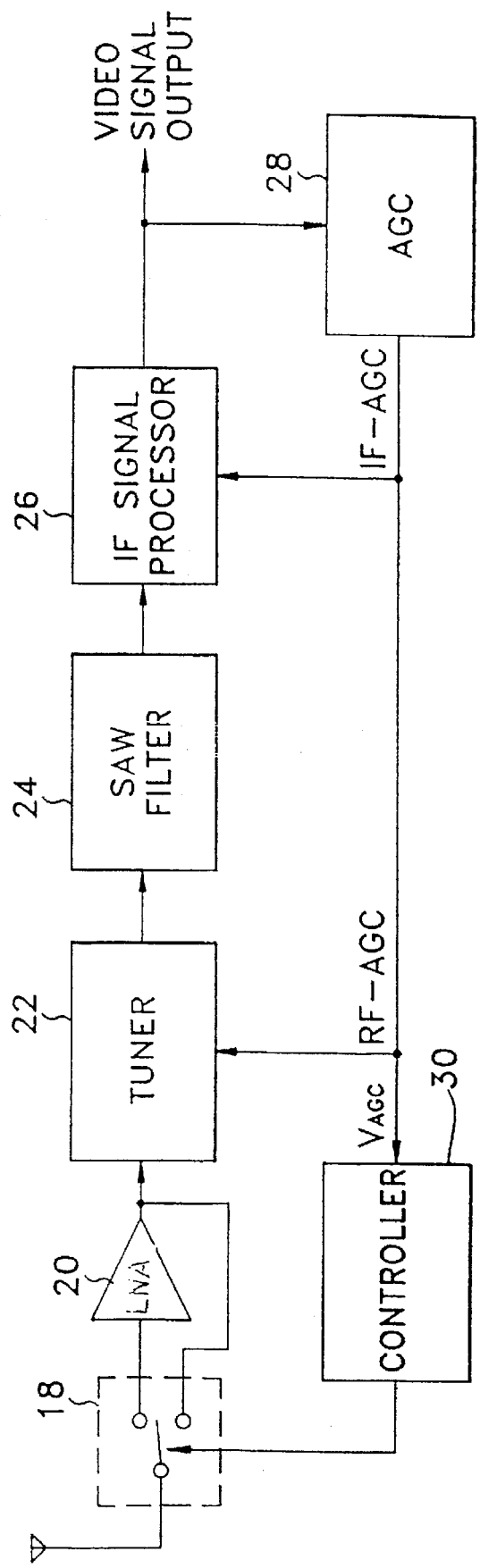

BROADCAST SIGNAL RECEIVER HAVING A LOW-NOISE AMPLIFIER INSERTED BEFORE A TUNER

BACKGROUND OF THE INVENTION

The present invention relates to a broadcast signal receiver, and more particularly, to a broadcast signal receiver where a low-noise amplifier is installed in front of a tuner so as to improve the reception sensitivity of the receiver.

In a conventional broadcast signal receiver, the noise figure of the system as a whole largely depends on its tuner. As the system's noise figure becomes smaller, the receiver's sensitivity is enhanced. Therefore, a tuner having a low noise figure is highly desirable.

To lower the tuner noise figure, high-quality tuner components are required, which increases manufacturing costs. On the other hand, due to the innate structure of the tuner, the insertion loss of a filter installed at the front end of the tuner limits the obtainable degree of noise figure improvement.

FIG. 1 shows a conventional broadcast signal receiving device.

Referring to FIG. 1, reference numeral 10 denotes a tuner for receiving a radio frequency (RF) signal from an antenna and for tuning a desired channel to output an intermediate frequency (IF) signal, reference numeral 12 denotes a surface acoustic wave (SAW) filter for limiting the IF bandwidth signal, reference numeral 14 denotes an IF signal processor for outputting the bandwidth-limited IF signal as a video signal.

The system noise figure $NF_{sys}$ of the conventional broadcast signal receiver shown in FIG. 1 can be expressed as follows.

$$NF_{sys} = NF_{tun} + \frac{NF_{fil} - 1}{G_{tun}} + \frac{NF_{amp} - 1}{G_{tun} \times G_{fil}} \quad (1)$$

Here, $NF_{tun}$ is the tuner's noise figure, $NF_{fil}$ is the SAW filter's noise figure, $NF_{amp}$ is the total noise figure of the IF stages (IF signal processor), $G_{tun}$ is tuner gain, and $G_{fil}$ is the loss (negative gain) of the SAW filter.

As can be seen in expression (1), the noise figure of an overall system is effectively determined by the noise figure and gain of the first stage of the system. That is, the noise figure ($NF_{sys}$) of a conventional overall system is determined by the tuner's noise figure ($NF_{tun}$) and gain ($G_{tun}$), Here, the tuner, which plays the most significant role in determining the noise figure of an overall system, has a problem in that both the noise figure and the gain vary according to the channel of a broadcast signal which is received, so that the sensitivity may worsen according to the specific channel received.

In addition, the internal constitution of a conventional tuner for tuning an NTSC broadcast signal consists of respective filters for the VHF and UHF bands at the front end of the tuner, as is widely known. Therefore, the noise figure of the system is inevitably increased due to the insertion loss (negative gain) of the filters.

In the meantime, for relatively weak input signals, a simple booster stage is employed in front of the tuner to compensate for the low input level. However, the noise figure of the booster stage (8–12 dB) is generally larger than that of the tuner (4–10 dB), so that receiver sensitivity suffers. An RF amplifier having a noise figure lower than that of the booster stage can be installed in front of a tuner, without employing a booster stage, but most such amplifiers cannot cover the entire receiving band, say, 50–900 MHz, of a typical broadcast signal receiver. Thus, one RF amplifier for VHF channels and another for UHF channels are required, which complicates the circuitry.

SUMMARY OF THE INVENTION

Accordingly, it is an object of the present invention to provide a broadcast signal receiving device having an enhanced reception sensitivity by installing an amplifier having a low noise figure and high gain in front of the tuner stage, thus reducing the noise figure of the overall system.

It is another object of the present invention to provide a simplified broadcast signal receiving device where an amplifier having a low noise figure and a high gain and which can receive frequencies over an entire reception band is installed in front of a tuner.

To accomplish the above object, there is provided a broadcast signal receiving device having a video signal processor for processing, as a video signal, an IF signal which is output via a tuner for tuning an externally input RF signal as a specific channel signal, the device comprising: a low-noise amplifier for amplifying the RF signal to provide to the tuner and which has a noise figure lower than that of the tuner. The noise figure of the receiver is thereby improved owing to the low noise figure and gain of the low-noise amplifier, and receiver sensitivity is thusly enhanced.

BRIEF DESCRIPTION OF THE DRAWINGS

The above objects and other advantages of the present invention will become more apparent by describing in detail a preferred embodiment thereof with reference to the attached drawings in which:

FIG. 1 is a block diagram showing a conventional broadcast signal receiving device;

FIG. 2 is a block diagram showing embodiment 1 of a broadcast signal receiving device of the present invention;

DETAILED DESCRIPTION OF THE INVENTION

Figure 3:
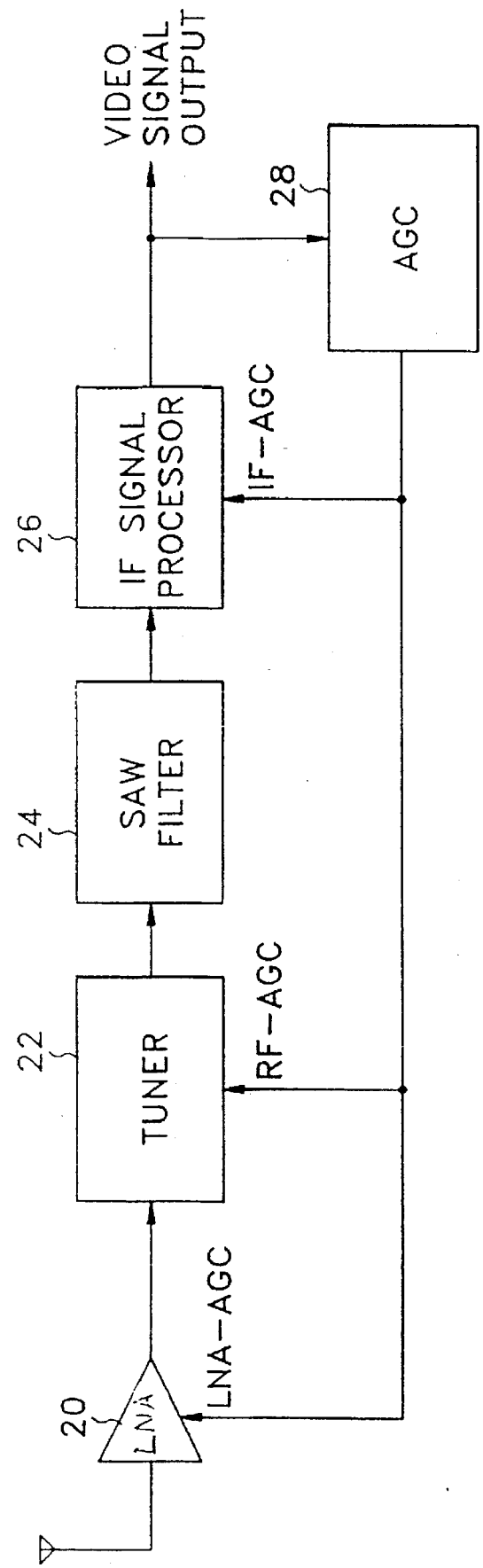
FIG. 3 is a block diagram showing embodiment 2 of a broadcast signal receiving device of the present invention.

FIG. 2 is a block diagram showing embodiment 1 of a broadcast signal receiving device of the present invention.

Referring to FIG. 2, reference numeral 18 denotes a control switch whose fixed contact receives a broadcast signal via an antenna, the switch having a first selection contact and a second selection contact connected to the input of a tuner 22, reference numeral 20 denotes low noise amplifier (LNA) having a high gain and whose noise figure is much better than a conventional RF amplifier, whose input is connected to the first selection contact of control switch 18, reference numeral 28 denotes an automatic gain control (AGC) circuit for outputting an AGC signal according to a level of an output signal of an IF signal processor 26, reference numeral 30 denotes a controller for determining whether the signal received from the antenna is strong or weak on the basis of the AGC signal and for outputting a control signal based on the determination result to a selection control terminal of control switch 18.

Reference numerals 22, 24 and 26 denote components operating the same as those of reference numerals 10, 12 and 14 of FIG. 1. A tuner 22 consists of a VHF filter (not shown) for processing the VHF signal input via an antenna, an RF amplifier (not shown) for amplifying the output signal of the VHF filter, a local oscillator (not shown) for generating the video carrier frequency of a broadcast channel signal to be higher than a predetermined frequency (45.75 MHz for the case of NTSC), and a mixer (not shown) for mixing an output of the local oscillator with an output of the RF amplifier so as to output an IF signal. Tuner 22 is not limited to a tuner for VHF channels and a tuner for UHF channels is also available.

A SAW filter 24 is a kind of bandpass filter for limiting the bandwidth of an IF signal output from tuner 22.

As is widely known, an IF signal processor 26 consists of a multi-stage IF amplifier for amplifying an IF signal output from SAW filter 24, a video signal detector for detecting a video signal from an output signal of the IF amplifier and a video signal amplifier for amplifying an output signal of the video signal detector. Here, for convenience, only a video signal processing performed by IF signal processor 26 is explained. However, a component for detecting a sound signal from the IF signal is included.

An operation of the broadcast signal receiving device shown in FIG. 2 will be explained.

First, the system noise figure $NF_{sys}$ of an overall system where LNA 20 is installed in front of tuner 22 can be expressed as follows.

$$NF_{sys} = NF_1 + \frac{NF_{tun} - 1}{G_1} + \frac{NF_{fil} - 1}{G_1 G_{tun}} + \frac{NF_{amp} - 1}{G_1 G_{tun} G_{fil}} \quad (2)$$

Here, $NF_1$ and $G_1$ are the noise figure and gain of the LNA 20, respectively.

As shown in expression (2), the noise figure ($NF_{sys}$) of an overall system is largely determined by the noise figure of the first stage of a system as well as its gain. That is, the noise figure ($NF_1$) and gain ($G_1$) of LNA 20 are decisive factors for determining the noise figure of the overall system.

To enhance the sensitivity of an overall system, the noise figure ($NF_{sys}$) of the overall system has to be a small value. In order to make $NF_{sys}$ a small value, the noise figure ($NF_1$) of LNA 20, i.e., the first element, has to be a small value and gain ($G_1$) of LNA 20, i.e., the second element, has to be a large value.

Accordingly, in the present invention, LNA 20 having a low noise figure and high gain is installed in a front stage of tuner 22 so as to prevent a signal loss generated when an input signal is tuned. In addition, the noise figure of an overall system becomes small, to thereby enhance the sensitivity of the overall system.

LNA 20 is constituted by an integrated circuit, which receives signals over the entire receiving band (50 MHz to 900 MHz) and amplifies the signal differently from an RF amplifier. In addition, LNA 20 has excellent $IP_2$ and $IP_3$ characteristics (the second- and third-order intercept points) with respect to a multi-input signal of the whole band and an excellent characteristic for preventing a disturbance wave. Thus, cross-modulation can be prevented.

Accordingly, LNA 20 of the present invention has a noise figure of approximately 2 dB which is smaller than that (4 dB to 8 dB) of a tuner, and a gain which is set to have a maximum value considering the $IP_2$ and $IP_3$ characteristics.

Meanwhile, since an RF signal received by an antenna can be a strong or weak signal, it is determined whether the input signal is strong or weak. Then, signal processing varies according to the determination result. Since saturation may occur, a strong RF signal need not be amplified.

Accordingly, LNA 20 is not engaged if a strong RF signal is received and is engaged if the received RF signal is weak.

In other words, if the received RF signal is strong, control switch 18 is connected to a second selection terminal so as to input a signal directly to tuner 22 from an antenna. If the received signal is weak, control switch 18 is connected to a first selection terminal so as to provide the signal input to LNA 20.

Meanwhile, an automatic gain control (AGC) circuit 28 outputs to IF signal processor 26 an AGC signal generated corresponding to a level of a video signal output from IF signal processor 26 as a signal (IF-AGC) for controlling the gain of an IF amplifier, to tuner 22 as a signal (RF-AGC) for controlling the gain of an RF amplifier, and to controller 30 as a signal ($V_{AGC}$) for determining whether a strong or a weak signal is being received.

Here, AGC 28 generates an AGC signal by employing a level of a burst signal or a sync tip among video signals output from IF signal processor 26. That is, AGC circuit 28 outputs an AGC signal having a small value when a strong signal is input from an antenna and an AGC signal having a large value when a weak signal is input.

Controller 30 outputs to control switch 18 a selection control signal for determining whether an RF signal input according to the AGC signal is strong or weak. If the RF signal is determined to be strong, control switch 18 is set to a second selection contact. If the RF signal is determined to be weak, control switch 18 is set to a first selection contact. For example, controller 30 sets control switch 18 to a second selection contact if the magnitude of the RF signal is larger than 70 dBμ (decibel to micro voltage) and otherwise sets it to a first selection contact.

FIG. 3 is a block diagram of embodiment 2 of a broadcast signal receiving device of the present invention. Here, the same reference numerals as those of FIG. 2 denote the same components and a detailed explanation thereof will therefore be omitted.

Referring to FIG. 3, the output of AGC circuit 28 and an input terminal of LNA 20 are connected so as to control the gain of LNA 20 according to an AGC signal output from AGC circuit 28, instead of control switch 18 and controller 30 shown in FIG. 2.

The device shown in FIG. 3 operates as follows. AGC circuit 28 outputs to IF signal processor 26 an AGC signal generated corresponding to a level of a video signal output from IF signal processor 26 as a gain control signal (IF-AGC) so as to control the gain of an IF amplifier, to tuner 22 as a gain control signal (RF-AGC) so as to control the gain of an RF amplifier, and to LNA 20 as a gain control signal (LNA-AGC) so as to control the gain of LNA 20.

Figure 4:
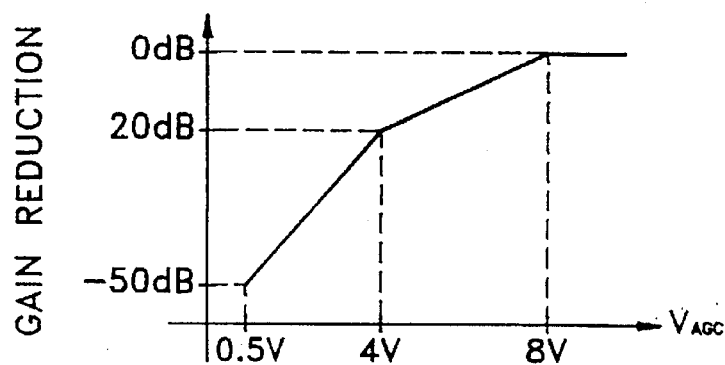
FIG. 4 is a graphical illustration showing automatic gain control characteristics of the tuner shown in FIG. 3.

The AGC characteristics of tuner 22 are shown in FIG. 4. Referring to FIG. 4, the horizontal axis represents AGC signal amplitude output from AGC 28 while the vertical axis represents the reduction in the gain of an RF amplifier according to the AGC signal.

For example, if the AGC signal is above 8 V, an extremely small RF signal is received. Therefore, an RF amplifier of tuner 22 does not reduce the gain of a signal which is amplified according to the gain of the original RF amplifier. If the AGC signal is from 0.5 V to 8 V, the RF amplifier of tuner 22 reduces the gain of the amplified RF signal. Here, the RF amplifier does not reduce the gain reduction uniformly. That is, the RF amplifier is gain-controlled so that the gain reduction can be increased when the AGC signal corresponds to a strong input signal, i.e., below 4 V, rather than when the AGC signal corresponds to a weak input signal, i.e., above 4 V. Here, for example, an original gain of the RF amplifier is 40 dB and a maximum gain reduction is −50 dB.

Regarding the order of gain control, according to one arrangement, an IF amplifier is firstly gain-controlled according to an AGC signal and an RF amplifier and an LNA are gain controlled at the same time. According to another arrangement, an IF amplifier, RF amplifier and LNA are sequentially gain controlled according to an AGC signal. For reference, in a conventional device, an IF amplifier is gain-controlled according to the AGC signal and an RF amplifier is gain-controlled.

Figure 5A:
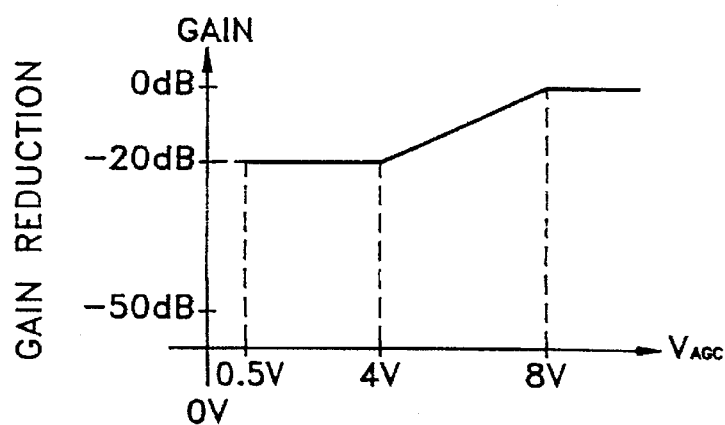
FIG. 5A and FIG. 5B are graphical illustrations showing automatic gain control characteristics of the low-noise amplifier shown in FIG. 3.

AGC characteristics of LNA 20 when an IF amplifier is gain-controlled according to the AGC signal and RF amplifier and LNA are simultaneously gain-controlled are shown in FIG. 5A. Referring to FIG. 5A, for example, LNA 20 has a gain of 20 dB and maximum gain reduction of −20 dB. The AGC characteristics are the same as that of the tuner of FIG. 4 when the AGC signal ranges from 4 V to 8 V. However, the gain reduction stays at −20 dB (maximum gain reduction of LNA) when the AGC signal ranges from 0.5 V to 4 V.

Figure 5B:
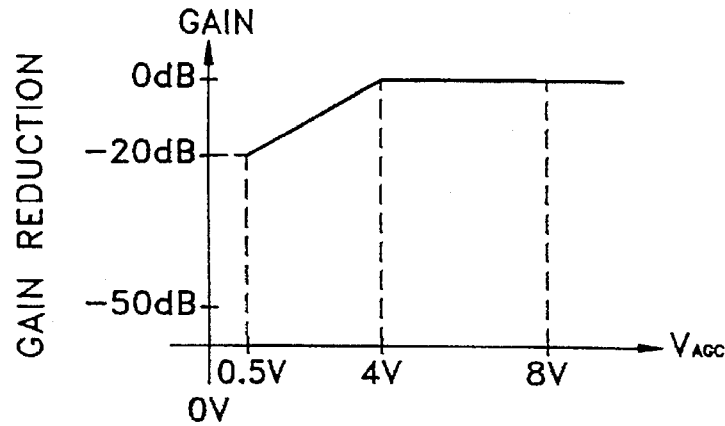

For the case where an IF amplifier, RF amplifier and LNA are sequentially gain-controlled according to an AGC signal, LNA 20 has AGC characteristics as shown in FIG. 5B. Referring to FIG. 5B, when the AGC signal ranges from 4 V to 8 V, LNA 20 is not operated, while the gain of RF amplifier of tuner 22 is decreased according to AGC signal. When the AGC signal ranges from 0.5 V to 4 V, LNA 20 is operated, to thereby reduce the gain to −20 dB (maximum gain reduction of LNA).

Here, the AGC characteristics of LNA 20 shown in FIG. 5A and 5B are for embodiments where an AGC characteristic varies according to an order of gain control. Therefore, there may be various modifications based on experiments and experience.

Meanwhile, as a gain of tuner 22 is reduced according to the AGC signal, the impedance and voltage standing wave ratio (VSWR) of tuner 22 are changed. As a result, the noise figure changes and sensitivity is degraded. Accordingly, when LNA 20 is controlled by AGC signal, changes in the impedance and VSWR of tuner 22 according to the variation of the AGC signal must be kept to a minimum.

Figure 6:
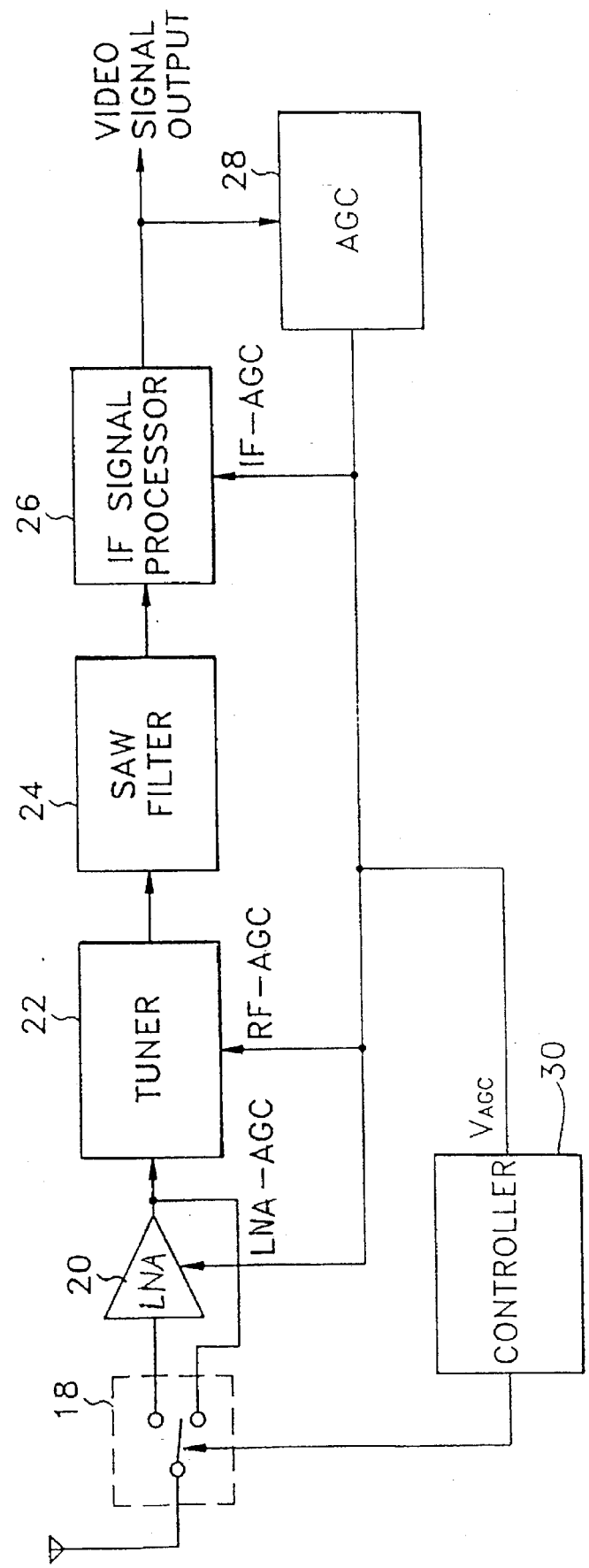
FIG. 6 is a block diagram showing embodiment 3 of a broadcast signal receiving device of the present invention.

FIG. 6 is a circuit diagram of another embodiment of a broadcast signal receiving device of the present invention, where the devices shown in FIG. 2 and FIG. 3 are combined. Referring to FIG. 6, in a range where the noise figure of tuner 22 is not changed and the reception sensitivity is not degraded even when a gain is reduced according to the AGC signal, control switch 18 is turned to a first selection contact so as to control a gain-control of LNA 20 according to the AGC signal. Otherwise, control switch 18 is turned to a second selection contact so as to input an RF signal directly to tuner 22 without employing LNA 20.

As described above, a broadcast signal receiving device of the present invention has a low noise amplifier having a low noise figure and a high gain, and is installed in a front end of a tuner, to thereby enhance the noise figure of an overall system.

In the present invention, since the characteristics of a tuner do not greatly affect the noise figure of an overall system, the effects of the tuner are low even when the characteristics of the tuner vary among the channels.

Moreover, in the present invention, the low noise amplifier having a low noise figure and a high gain and which is installed in a front end of a tuner operates only in a weak electric field, to thereby enhance system sensitivity especially in a weak electric field.

Further, in the present invention, the low noise amplifier installed in a front end of a tuner is controlled in connection with an IF amplifier and an RF amplifier, to thereby provide a flexible control according to a level of a received RF signal.

In addition, a low noise amplifier for covering all bands of a received signal is employed so as to enhance reception sensitivity by a simplified device.

What is claimed is:

1. A broadcast signal receiver comprising:

tuning means for tuning an externally input radio frequency (RF) signal as a specific channel signal;

automatic gain control (AGC) means for generating an AGC signal based on an output level of said tuning means so that the output level of said tuning means can be maintained at a predetermined level;

a low-noise amplifier having a noise figure lower than that of said tuning means, for amplifying said RF signal and outputting the amplified result to said tuning means;

determining means for determining the strength of said RF signal according to said AGC signal and outputting a determination control signal based on a predetermined threshold; and switching means for controlling said RF signal to be output selectively to said low-noise amplifier or directly to said tuning means, according to said determination control signal.

2. A broadcast signal receiver comprising:

tuning means for tuning an externally input radio frequency (RF) signal as a specific channel signal;

automatic gain control (AGC) means for generating an AGC signal based on an output level of said tuning means and applying the AGC signal to said tuning means to control the gain of said tuning means so that the output level of said tuning means can be maintained at a predetermined level; and a low-noise amplifier having a noise figure lower than that of said tuning means, for amplifying said RF signal and outputting the amplified result to said tuning means, and whose gain is controlled according to said AGC signal.

3. A broadcast signal receiver according to claim 2, wherein said tuning means and said low-noise amplifier are simultaneously gain-controlled according to said AGC signal.

4. A broadcast signal receiver according to claim 2, wherein said tuning means and said low-noise amplifier are sequentially gain-controlled according to said AGC signal.

5. A broadcast signal receiver comprising:

tuning means for tuning an externally input radio frequency (RF) signal as a specific channel signal;

automatic gain control (AGC) means for generating an AGC signal based on an output level of said tuning means so that the output level of said tuning means can be maintained at a predetermined level;

a low-noise amplifier having a noise figure lower than that of said tuning means, for amplifying said RF signal and outputting the amplified result to said tuning means, and whose gain is controlled according to said AGC signal;

determining means for determining the strength of said RF signal according to said AGC signal and outputting a determination control signal based on a predetermined threshold; and switching means for controlling said RF signal to be output selectively to said low-noise amplifier or to said tuning means, according to said determination control signal.

6. A broadcast signal receiver according to claim 5, wherein said low-noise amplifier is gain-controlled according to said AGC signal according to a characteristic wherein the noise figure of said tuning means is not changed even when a gain of said tuning means is reduced according to said AGC signal.

7. A broadcast signal receiver according to claim 5, wherein said switching means selectively outputs said RF signal to said tuning means according to said AGC signal, thus changing a noise figure of the broadcast signal receiver, when the gain of said tuning means is reduced.

* * * * *